United States Patent [19]
Kong

[11] Patent Number: 6,040,996
[45] Date of Patent: Mar. 21, 2000

[54] CONSTANT CURRENT PROGRAMMING WAVEFORMS FOR NON-VOLATILE MEMORIES

[75] Inventor: Sik On Kong, Singapore, Singapore

[73] Assignee: Chartered Semiconductor Manufacturing, Ltd., Singapore, Singapore

[21] Appl. No.: 09/192,337

[22] Filed: Nov. 16, 1998

[51] Int. Cl.[7] .................................................. G11C 16/04
[52] U.S. Cl. .............................. 365/185.19; 365/185.18; 365/185.2; 365/185.28
[58] Field of Search ......................... 365/158.19, 185.18, 365/185.2, 185.28

[56] References Cited

U.S. PATENT DOCUMENTS

| | | | |
|---|---|---|---|
| 4,434,478 | 2/1984 | Cook et al. | 365/185 |
| 5,042,009 | 8/1991 | Kazerounian et al. | 365/185 |
| 5,485,423 | 1/1996 | Tang et al. | 365/185 |
| 5,805,499 | 9/1998 | Haddad | 365/185.18 X |
| 5,856,946 | 1/1999 | Chan et al. | 365/185.19 |

*Primary Examiner*—Huan Hoang
*Attorney, Agent, or Firm*—George O. Saile; Rosemary L.S. Pike; Graham S. Jones, II

[57] ABSTRACT

An EEPROM MOSFET memory device with a floating gate and control gate stack above source and drain regions formed in a substrate self-aligned with the stack. There is a means for writing data to the floating gate electrode by applying an upwardly stepwise increasing control gate voltage $V_{CG1}$ waveform applied to the control gate of the EEPROM device. The waveform is a voltage ramp providing a substantially constant tunneling current into the floating gate electrode which is approximately constant with respect to time so programming speed and the number of write/erase cycles is increased. The means for threshold voltage testing compares the voltage of the drain electrode to a reference potential. The ramped pulse output is supplied to the control gate electrode by producing a sequence of increasingly higher counts to a decoder which provides sequential switching of successively higher voltage pulses from a voltage divider, and there is means for providing ramping programming voltages to the successively higher voltage pulses.

20 Claims, 9 Drawing Sheets

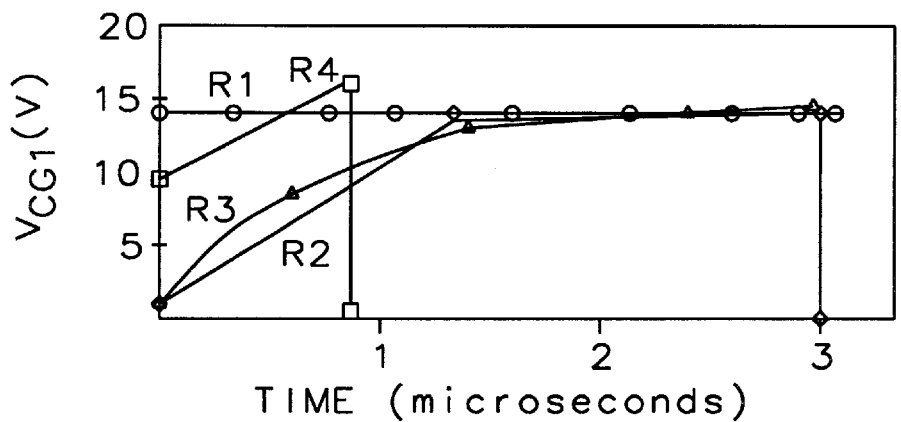
FIG. 4A - Prior Art
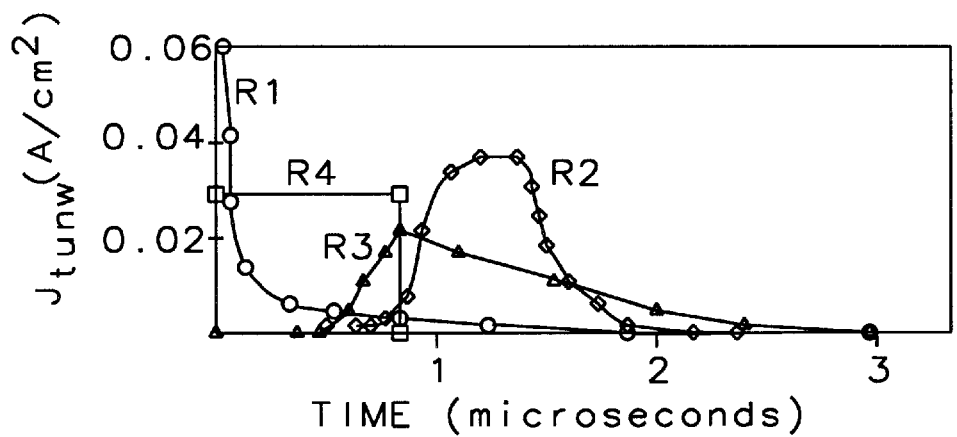
FIG. 4B - Prior Art
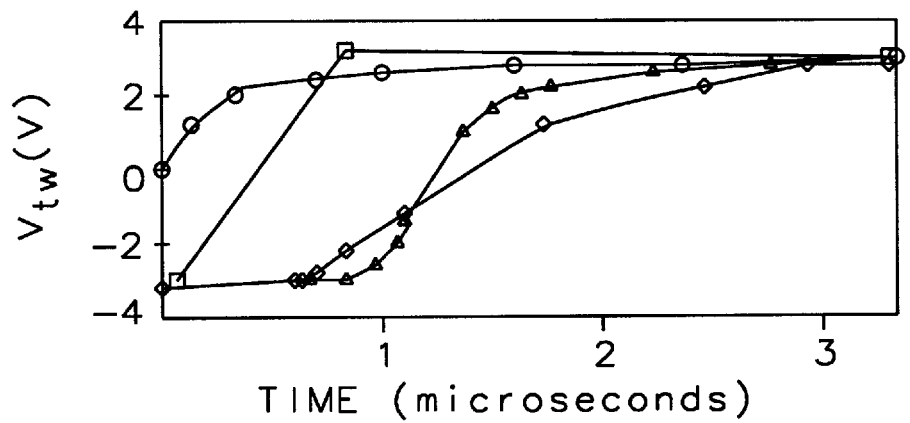
FIG. 4C - Prior Art

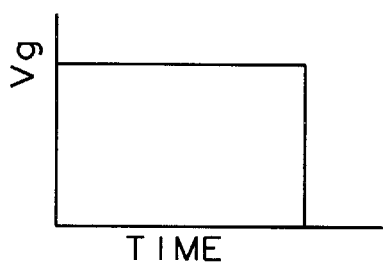
FIG. 6A - Prior Art
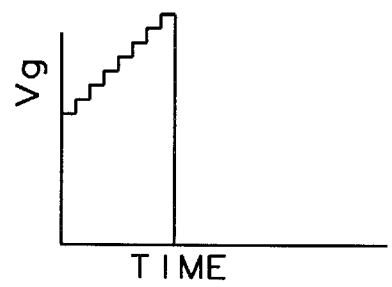
FIG. 7A
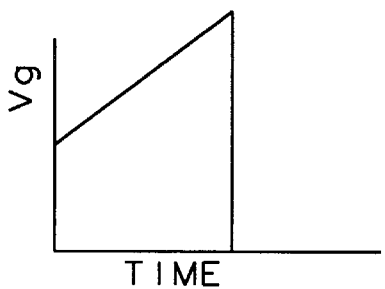
FIG. 6B - Prior Art
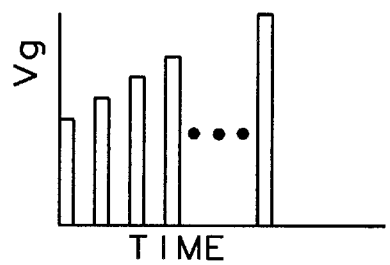
FIG. 7B
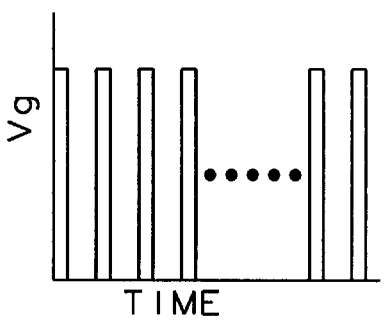
FIG. 6C - Prior Art
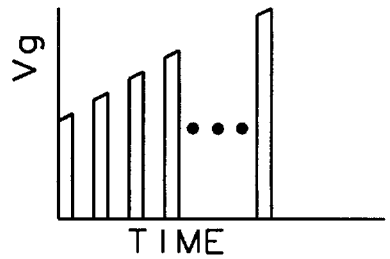
FIG. 7C

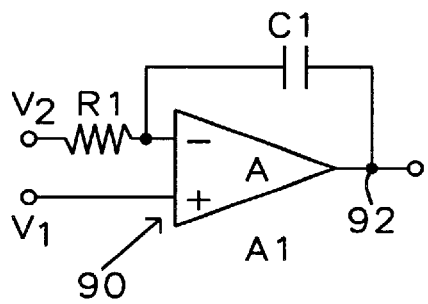
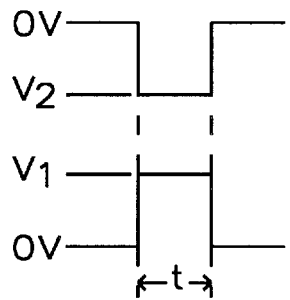
FIG. 9A          FIG. 9B
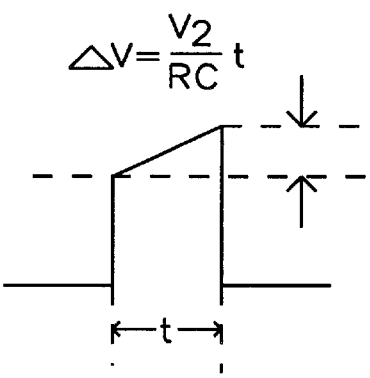
FIG. 9C
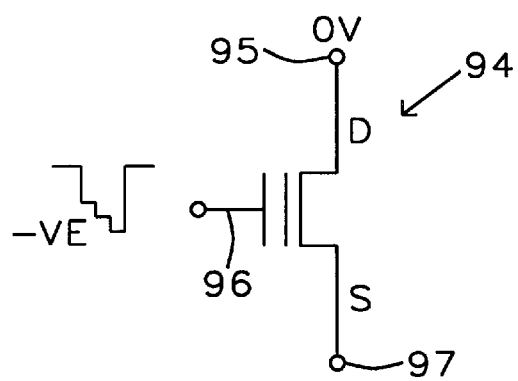
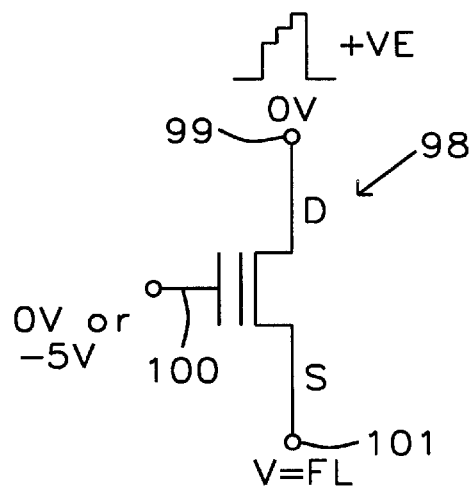
FIG. 10A         FIG. 10B

CONSTANT CURRENT PROGRAMMING WAVEFORMS FOR NON-VOLATILE MEMORIES

BACKGROUND OF THE INVENTION

1. Field of the Invention

This invention relates to non-volatile memories including EPROM, EEPROM, and flash memory devices and more particularly to the form of programming voltages applied to non-volatile memory devices which utilize Fowler-Nordheim programming, hot electron injection or avalanche injection as the method of programming such devices.

2. Description of Related Art

Electrons in the floating gate of non-volatile memories repel electrons. By applying a programming pulse with a square shaped trace, the tunnelling current produces spikes at the start of a programming step and decreases dramatically afterwards. This results in long programming times. Such a voltage spike degrades the tunneling oxide layer. This results in a small number of programming cycles available before the tunneling oxide layer fails to be an insulating layer.

U.S. Pat. No. 5,485,423 of Tang for "Method for Eliminating of Cycling-Induced Electron Trapping in the Tunneling Oxide of 5 Volt Only EEPROMS" shows a method for applying a relative low positive voltage to a source region of a EEPROM during the erase cycle. However, this reference differs from the type of waveform voltage of the program and erase of the invention.

U.S. Pat. No. 5,042,009 of Kazerounian for "Method for Programming a Floating Gate Memory Device" shows a method of programming a floating gate using a charge pump to provide a drain current. The gate voltage rises from a first value to a second value during programming. However, the gate voltage is used for the limitation of the drain current rather than to produce a constant programming current for the optimization of programming speed and number of programming cycles.

See U.S. Pat. No. 4,434,478 of Cook et al. for a system and method for "Programming Floating Gate Devices". Cook et al. describes incrementing the gate voltage in a stepped or a continuously increasing voltage such as a linear or exponential ramp.

GLOSSARY

RAM=Random Access Memory

Memories, with cells which can be accessed at random, rapidly accessible for both writing and reading.

ROM=Read Only Memory

Memories in which the read, but not the write operation can be performed rapidly by a process referred to as programming which is slower or more complex than writing data into a RAM.

PROM (Programmable ROM)

Programmable ROMs are ROMs into which information can be programmed, but then cannot be erased. When a PROM is originally manufactured, a data path exists between every word and bit line so there is a "1" stored in every data position. Storage cells are selectively altered to store a "0" following manufacture by destructively severing selected word-to-bit connection paths. After the write operation a "0" programmed into a bit location cannot be reversed back to a "1" in a PROM.

EPROM (ERASABLE PROGRAMMABLE ROM)

Erasable PROMs are formed of MOS FET devices which include floating polysilicon gates, floating in the sense that the floating gate is not connected to any electrical conductor, but is isolated by dielectric materials. The floating gate provides long-term retention of electronic charge as the information-storage mechanism of the EPROM. The charge is transferred to the floating gate from the silicon substrate through an insulator layer.

A form of electrically programmable EPROM can be erased by irradiation of the device with ultraviolet (UV) light to remove (erase) the stored charge from the floating gate.

For an NMOS EPROM, during the read operation, if the floating gate is not charged with a sufficient number of electrons, inversion of the channel region under the gate will occur. A conducting channel region would then form between the source and the drain, if an external gate voltage were applied. However, with charge accumulated in the floating gate electrode, channel formation is prevented even with the application of a gate voltage. The presence of a "1" or "0" in each bit location is therefore determined by the presence or absence of a conducting channel region in a programmed device.

For a PMOS EPROM device, the action is reversed. The presence of the electron assist channel formation and the absence of the electrons prevents it.

FLOTOX EEPROMS

Referring to FIG. 3, a fragmentary, sectional view of a prior art FLOating-gate Tunneling OXide (FLOTOX) transistor 102 is shown formed on a P- substrate 122 on the surface of which FOX (Field OXide) regions 142, 142' are formed. Formed between FOX regions 142, 142' on the surface of substrate 111 are included a gate conductor stack 162 comprising two polysilicon gates FG2 and CG2; a polysilicon oxide inter-conductor layer ICD2, about 50 nm thick, which is formed between gate electrodes FG2 and CG2; and below the floating gate FG2 and over the drain D2 is formed a thin tunnel oxide (silicon dioxide) layer TX2 preferably about 10 nm thick (from about 8 nm to about 12 nm). (Note that tunnel oxide layer TX2 can be composed of an oxynitride.) The floating gate CG2 is formed above channel region CH2 in the substrate 122 and a portion of drain region D2 on the right. An N+ doped source region S2 is formed on the left side of the stack 162, self-aligned with stack 162, unlike the drain region D2. The lower polysilicon layer is the floating-gate electrode FG2, while the upper polysilicon layer is the control gate electrode CG2. The remainder of the space between floating gate FG2 and channel region CH2 and source/drain regions S2/D2 is the gate oxide GOX which is typically 50 nm (500 Å) thick.

Programming of the FLOTOX transistor 102 is done by causing electrons to be transferred from the substrate 122 to the floating gate electrode FG2 through tunnel oxide layer TX2 using Fowler-Nordheim tunneling. Tunneling occurs at a high control-gate voltage value of $V_{CG2}$ of from about 12 V to about 18 V, when the drain voltage $V_{D2}$ is 0 V, the source voltage $V_{S2}$ is 0 V, and the substrate voltage $V_{ss}$ is 0 V. As electrons accumulate in floating gate FG2, charge builds on the floating gate FG2 causing the electric field to be reduced thereby decreasing electron flow. Since the tunneling process is reversible, the floating gate FG2 can be erased by grounding the control gate CG2 ($V_{CG2}$=0) and raising the drain voltage $V_{D2}$ to a high enough voltage for that purpose, while the source voltage $V_{S2}$ is disconnected, and the substrate voltage $V_{SS}$ is 0 V. Thus, Fowler-Nordheim tunneling is used both to program and to erase the FLOTOX transistor 102. Programming and erase times are on the order of 0.1 to 10 milliseconds. A FLOTOX transistor 102 can retain a charge for years, normally.

In an article by Sik On Kong and Chee Yee Kwok, entitled "A Study of Trapezoidal Programming Waveform for the FLOTOX EEPROM" published in Solid-State Electronics, Vol. 36, No. 8, pp. 1093–1100, (1993) it was stated in the Abstract that an analysis was made of "the effect of some different programming waveforms on the tunneling current and threshold voltage of the FLOTOX EEPROM . . . ". It stated further, "Four waveforms have been considered; square, linear ramping, exponential and, a new proposal, trapezoidal. It is shown that the trapezoidal programming waveform is the only one which can produce a constant tunneling current, and therefore it is possible to optimize programming time and achieve tunneling field and current levels consistent with the objective of improving the long term reliability of FLOTOX EEPROM." However, the shape of the waveform needs to be generated by linear circuits which are not easily optimized in digital circuit design. The stepwise ramping waveforms proposed in FIGS. 7A and 7B use only digital circuits and are therefore easier to incorporate. Digital circuits also allow interactive programming and threshold voltage detection, which results in tight $V_{tw}$ control.

In a Flash memory device, the programming can be done bit by bit and the erase can be done in the page mode, whereby a lot of bits can be erased together. The present invention covers all flash memory devices as well as other EEPROM devices including the FLOTOX EEPROM.

The equations used in the article by Sik On Kong and Chee Yee Kwok are as follows:

WRITE OPERATION $$I_{tun} = A_{tun} \cdot \alpha \cdot E^2 \exp\left(-\frac{\beta}{E}\right)$$

$$V_{CG}(0) = \frac{EX_{tun}}{k_w} + [V_{tw}(0) - V_{ti}], \text{ where}$$

$$R_w = \frac{dV_g}{dt} + \frac{I_{tun}}{C_{pp}}$$

where $R_w$ . . . Control gate voltage ramp rate during write operation

α . . . characteristic constant (pre-exponential) - - - 3.69×10⁻⁷ AV⁻²

β . . . Characteristic constant (exponential) - - - 223 MV cm⁻¹

$A_{tun}$ . . . Tunneling area - - - 0.64 μm²

$C_{pp}$ . . . Plate to plate capacitance (CG2–FG2)

E . . . Electric field across the tunnel oxide $I_{tun}$ . . . Tunneling current defined by Fowler-Nordheim equation $X_{tun}$ . . . Tunnel oxide thickness - - - 8.0 nm $V_{CG}(0)$ . . . Control gate voltage at time=0

$V_{tw}(0)$ Threshold voltage before write operation - - - -3.0 V $V_{ti}$ . . . Neutral cell threshold Voltage - - - 0.0 V $k_w$ . . . Write operation coupling constant - - - 0.709

ERASE OPERATION $$V_d(0) = \frac{EX_{tun}}{k_e} + \frac{k_w}{k_e}[V_{ti} - V_{te}(0)], \text{ where}$$

$$R_e = \frac{I_{tun}}{C_{pp}} * \frac{k_w}{k_e}$$

$$t_e = C_{pp}\left|\frac{\Delta V_{te}}{I_{tun}}\right|$$

where $k_e$ . . . Erase operation coupling constant - - - 0.83

$V_{te}(0)$ . . . Threshold voltage before erase operation - - - 3.0V $R_e$ . . . Control gate voltage ramp rate during erase operation $t_e$ . . . Erase time $\Delta V_{te}$ . . . Total change of threshold voltage during erase operation - - - 6.0V

SUMMARY OF THE INVENTION

An advantage of this invention is that it increases the speed of writing and erasing data in a flash EEPROM device or other EEPROM devices by a factor of two to three times.

Another advantage of this invention is that it increases the lifetime of a flash EEPROM device by a number of programming cycles.

A further advantage of this system is that linear ramping waveforms are provided.

In accordance with this invention, an EEPROM MOSFET memory device is provided with a substrate on which a gate electrode stack is formed on a doped silicon semiconductor material with a gate electrode stack including a tunnel oxide layer, a floating gate electrode and a control gate electrode with a dielectric layer between the floating gate electrode and the control gate electrode. It also includes source and drain regions formed in the substrate self-aligned with the stack. The source region is at a source voltage, the drain region is at a drain voltage and the substrate is at a substrate voltage. Means are provided for writing data to the floating gate electrode by applying an upwardly stepwise increasing control gate voltage $V_{CG1}$ waveform applied to the control gate of the EEPROM device. The waveform is a voltage ramp providing a substantially constant tunneling current into the floating gate electrode which is approximately constant with respect to time so programming speed and the number of write/erase cycles is increased. The means for threshold voltage testing compares the voltage of the drain electrode to a reference potential. There is means for providing the ramped pulse output to the control gate electrode by producing a sequence of increasingly higher counts to a decoder which provides sequential switching of successively higher voltage pulses from a voltage divider, and there is means for providing a ramping operational amplification to the successively higher voltage pulses.

Further in accordance with this invention, the method of operation of the above device is provided as described above and hereinafter.

BRIEF DESCRIPTION OF THE DRAWINGS

The foregoing and other aspects and advantages of this invention are explained and described below with reference to the accompanying drawings, in which:

FIG. 4A shows simulations of four programming waveforms of voltage $V_{CG1}$ in Volts as a function of time in for waveforms R1–R4

FIG. 4B shows the resultant tunneling current density curves as a function of time produced in response to the $V_{CG1}$ curves R1, R2, R3, and R4 in FIG. 4A.

FIG. 4C shows the write threshole voltage $V_{tunw}$ response to the waveforms R1, R2, R3, and R4 in FIG. 4A.

FIG. 6A shows a constant value of $V_g$ during programming.

In FIG. 6B a trapezoidal programming waveform is shown in which $V_g$ ramps from a starting value with a rate which compensates the repulsion of electrons, so that the tunneling current is a constant.

FIG. 6C is illustrates a type of "smart" programming where within a chip, there are many memory cells (e.g. 4 million).

FIG. 7A shows how a stepped ramping pulse is employed instead of the linear ramping pulse in FIG. 6B.

FIG. 7B shows a combination of the approaches of FIG. 6B and FIG. 6C with a series of pulses, with ramping amplitudes applied to the control gate.

FIG. 7C shows an set of pulses as in FIG. 7B with a ramping voltage for each pulse.

FIG. 9A shows an analog circuit 90 comprising an operational amplifier A1, with "+/−" inputs.

FIG. 9B shows the waveforms of voltages $V_1$ and $V_2$ with a square waveform for a duration "t" during which voltage $V_2$ falls below 0V whereas voltage $V_2$ rises above 0V for duration "t".

FIG. 9C shows the output on line 92 which is a pulse for duration "t" with a sawtooth value rising from the positive value $V_1$ by a delta amount.

FIG. 10A shows a device with the erase step or pulse voltage −VE applied to the control gate electrode of a floating gate memory MOS cell.

FIG. 10B shows a device with a voltage applied to the control gate electrode of a floating gate memory MOS cell.

DESCRIPTION OF THE PREFERRED EMBODIMENT

Figure 1A:
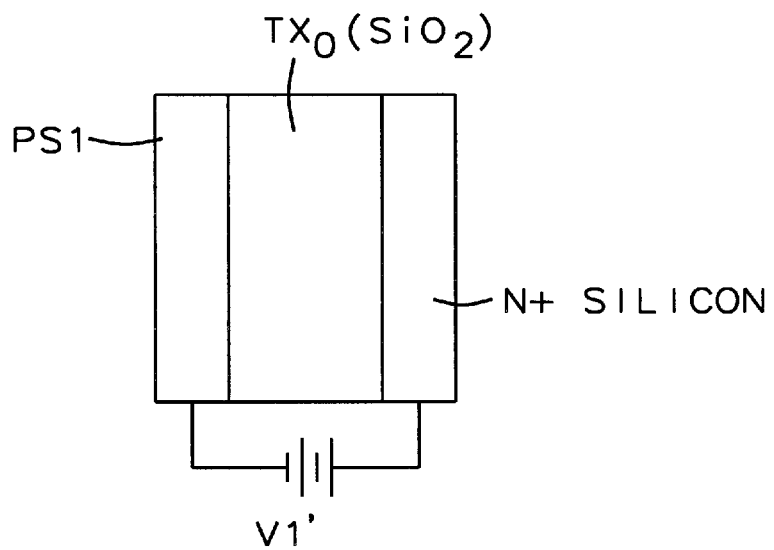
FIG. 1A shows a pair of electrodes including polysilicon electrode and N+ silicon electrode separated by a silicon dioxide layer.
Figure 2:
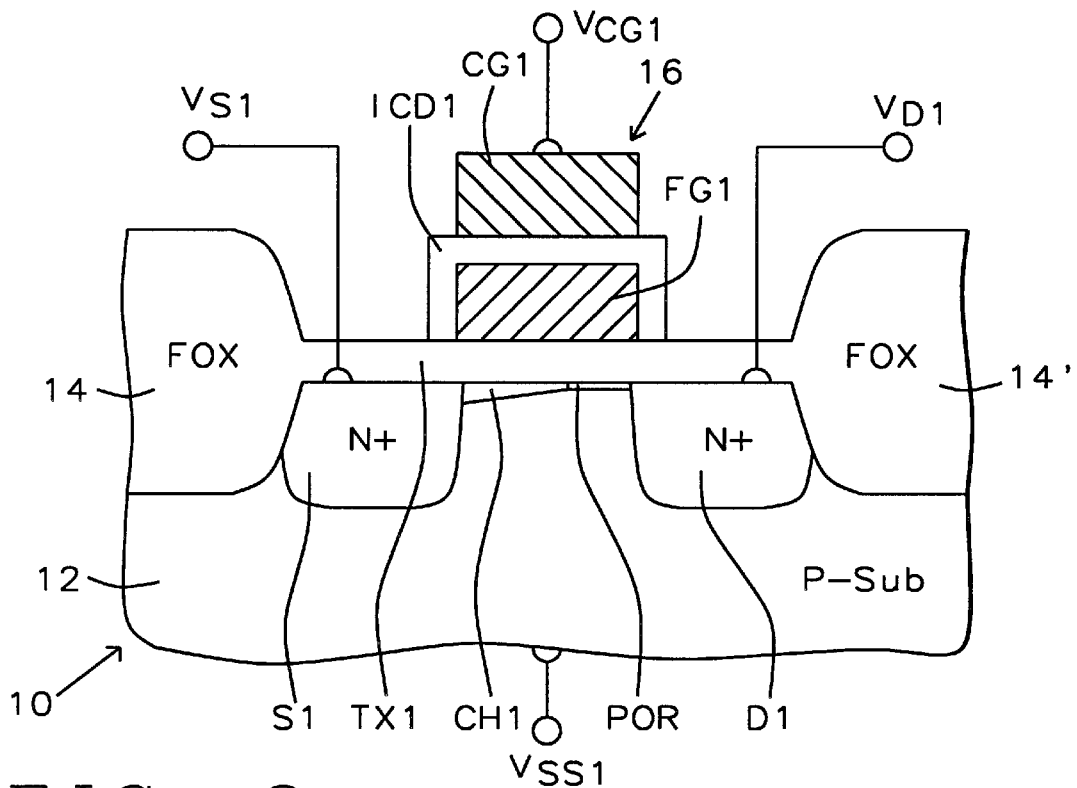
FIG. 2 shows a Flash EEPROM (Electrically Erasable PROgrammable Memory) device in accordance with this invention formed on an P-doped silicon semiconductor substrate.
Figure 3:
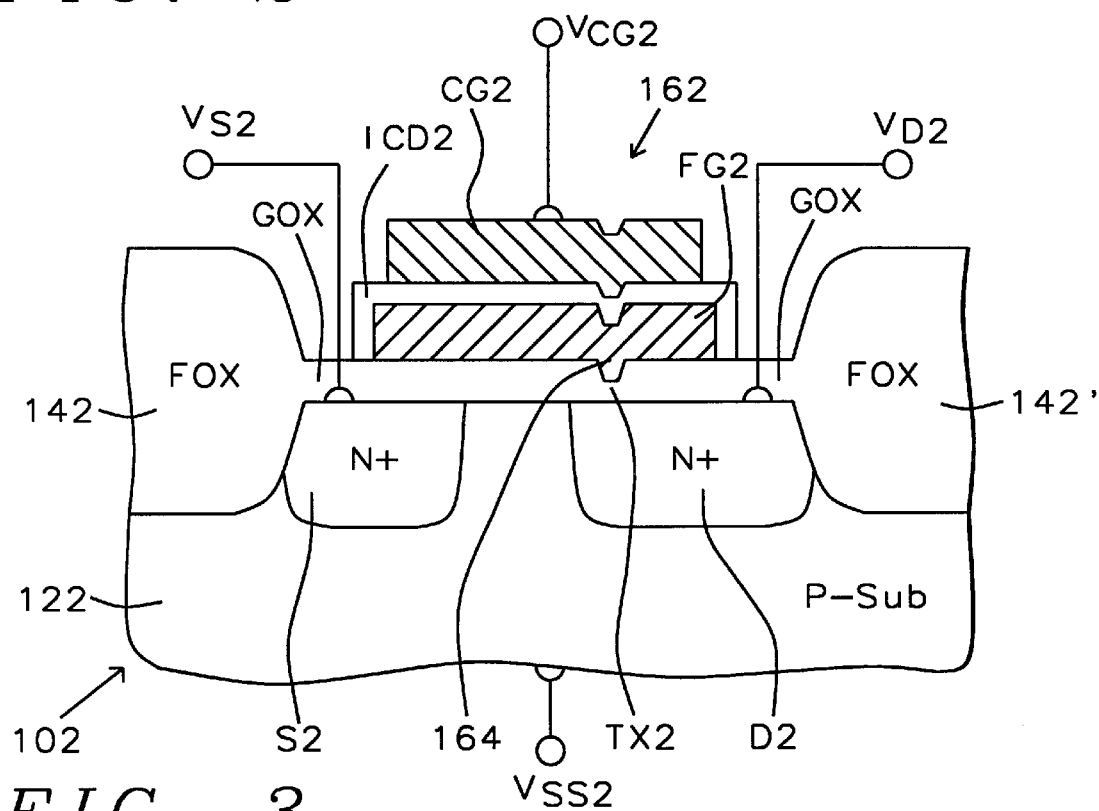
FIG. 3 shows a fragmentary, sectional view of a prior art FLOating-gate Tunneling OXide (FLOTOX) transistor.

Non-volatile EEPROM memory devices contain isolated floating gates such as gates FG1 and FG2 in FIGS. 2 and 3. Such devices can be programmed by electronic tunnelling from the channel region through a tunnel oxide layer TX0 such as the one shown in FIG. 1A.

Figure 1B:
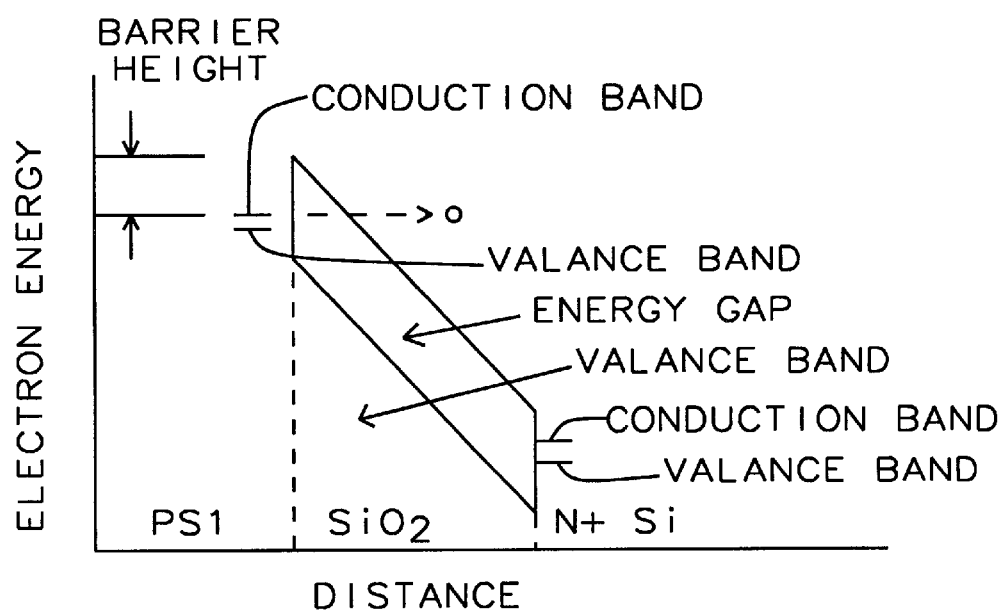
FIG. 1B shows an energy diagram for the device of FIG. 1A with an energy gap.

FIG. 1A shows a pair of electrodes including polysilicon electrode E1 and N+ silicon electrode E2 separated by silicon dioxide ($SiO_2$) layer $TX_o$ with a thickness of about 5 nm (50 Å). Polysilicon electrode E1 and N+ silicon electrode E2 are connected to opposite terminals of DC voltage supply $V_1'$, which is also applying a large voltage. FIG. 1B shows an energy diagram for the device of FIG. 1A with an energy gap.

This invention relates to all flash, EEPROM devices.
EEPROMS=ELECTRICALLY ERASABLE PROMS EEPROM devices are similar to EPROM devices in structure but the data in a ROM is erased electrically, rather than with a UV light source.

Flash EEPROMS

In a flash EEPROM device the data (charge) of many of the memory's array cells can be erased simultaneously as with a UV-EPROM, not with UV, but with an electrical erase signal. The speed is fast, i.e. the cells can be erased rapidly (1 or 2 seconds, compared to the 20 minutes required to erase a UV-EPROM).

The erasing mechanism in flash EEPROMs is Fowler-Nordheim tunneling of the floating gate to, according to different designs, the drain region, the source region or the channel region. Programming of the floating gates, is carried out in most flash cells by hot-electron injection into the gate.

The upper polysilicon layer forms a control gate electrode and the word lines of the structure, while the lower polysilicon layer comprises a floating gate electrode. The gate oxide can be about 10 nm thick, and the interpolysilicon dielectric can be an oxide/nitride/oxide (ONO) composite film about 17 nm thick.

FIG. 2 shows a Flash EEPROM (Electrically Erasable PROgrammable Memory) device 10 in accordance with this invention formed on a P-doped silicon semiconductor substrate 12 doped with P type dopant in which a flash memory device is formed between first and second FOX regions 14 and 14' which are formed on the surface of the substrate 11. Centered between the first and second FOX regions 14 and 14' on the surface of the substrate 12 is located a gate electrode stack 16. Self-aligned with the gate electrode stack 16 in the substrate 12 are a source region S1 on the left and a drain region D1 on the right formed in substrate 12. In the surface of the substrate 12, between the source S1 and the drain region D1, below the tunnel oxide layer TX1 are formed a channel region CH1 next to the source region S1 in the substrate 12. A pinch off region POR adjacent to the drain region D1 in the substrate 12 is formed during the write cycle when suitable bias voltages are applied. The source voltage of the source region S1 is $V_S$. The drain voltage of drain region D1 is $V_D$. The substrate voltage of substrate 12 is $V_{Sub}$. The control gate voltage is $V_{CG1}$.

Stack 16 includes the tunnel oxide layer TX1 which has a thickness of from about 50 Å to about 120 Å formed on the surface of the substrate 12 above the channel region CH1 and pinch off region POR. Above tunnel oxide layer TX1 is formed a conventional floating gate electrode FG1, composed of doped polysilicon having a thickness of from about 1,000 Å to about 5,000 Å, an Inter-Conductor Dielectric layer ICD1, preferably composed of ONO (silicon Oxide/silicon Nitride/silicon Oxide), and a control gate electrode CG1, composed of doped polysilicon having a thickness of from about 1,000 Å to about 5,000Å. Shown to the left of the gate electrode stack 16, is the self-aligned N+ doped source region S1 which is located between the gate electrode stack 16 and the first FOX region 14. The self-aligned N+ doped drain region D1 is located between gate electrode stack 16 and the second FOX region 14'. The N+ doped source/drain regions S1/D1 are doped with a concentration of phosphorus dopant from about 1 E 18 atoms/cm$^3$ to about 5 E 20 atoms/cm$^3$.

The N+ doped source region S1 and the N+ doped drain region D1 respectively overlap the opposing edges of the gate electrode stack 16 with the channel region CH1 of the Flash EEPROM device 10 located between N+ doped source region S1 and the pinch off region POR which is juxtaposed (in side-by-side relationship) with the N+ doped drain region D1. Note that the POR is a part of the channel region CH1. The POR is formed when the MOS is biased in the saturation region during the write cycle.

For the write operation, the tunnelling can be done by Fowler-Nordheim tunnelling as in a FLOTOX EEPROM as shown in the prior art, as in FIG. 3 or by hot electron tunnelling in Flash Memory EPROM devices of FIG. 2 normally.

FIG. 4A shows simulations of four programming waveforms of voltage $V_{CG1}$ in Volts as a function of time in milliseconds. The waveforms shown are as follows:

R1 positive square voltage pulse $V_{CG1}$

R2 linear voltage ramp towards a constant value

R3 exponentially rising voltage $V_{CG1}$

R4 Trapezoidal $V_{CG1}$=8.955V+(7.096V*t) where t=time

Please note that the simulations in FIG. 4A are for the FLOTOX EEPROM only, not for the flash memory.

When R1 positive square voltage R1 pulse $V_{CG1}$ is applied to the control gate CG1 which initiates the tunnelling as shown in FIG. 4A.

FIG. 4B shows the resultant tunneling current density curves $J_{tunw}$ (A/cm$^2$) as a function of time produced in response to the $V_{CG1}$ curves R1, R2, R3, and R4 in FIG. 4A. The resultant tunnel current density produced for curves R1, R2, R3, and R4 in Amperes/cm$^2$ vary as a function of time on the same scale as FIG. 4A.

FIG. 4C shows the write threshold voltage $V_{tunw}$ response to the waveforms R1, R2, R3, and R4 in FIG. 4A.

Since electrons repel electrons, referring to FIG. 4B, the result of application of voltage pulse $V_{CG1}$ R1 is that the R1 programming current $J_{tunw}$ as seen in FIG. 4B spikes to a very high value above 0.06 Amperes/cm$^{-2}$ in the range of 1 Amperes/cm$^{-2}$ to 10 Amperes/cm$^{-2}$ at the start and then, later, the programming current decreases dramatically after the start. The current spike of wave R1 degrades the tunnel oxide layer TX1, which results in a reduced number of achievable read/write cycles, and the decrease in programming current R1 in FIG. 4B prolongs the programming time which is typically 5 microsecond (ps) for the write operation (for hot electron tunnelling) and 1 millisecond (ms) for the write and erase operation with Fowler-Nordheim tunneling.

Different ramping waveforms R2 and R3 which have been used to alleviate the problem as shown in FIGS. 4A–4C, but the results of waveforms R2 and R3 are not optimized. The waveform in accordance with this invention is the trapezoidal waveform R4 which starts at a low value of about 8.955 Volts and ramps up to 14.6138 Volts after 0.8 milliseconds. A Table of the values of R4 is as follows:

TABLE I

| Time (ms) | 0.2 | 0.4 | 0.6 | 0.8 |
|---|---|---|---|---|
| Delta $V_{CG1}$ | 1.4192 | 2.8384 | 4.2576 | 5.6588 |
| $V_{CG1}t_o$ (ms) | 8.9550 | 8.9550 | 8.9550 | 8.9550 |
| Total $V_{CG1}$ | 10.3742 | 11.7934 | 13.2126 | 14.6138 |

The above $V_{CG1}$ values lead to tunneling current $I_{tun}$ in the gate oxide layer TX1. In accordance with curve R4, the voltage $V_{CG1}$ starts as the desirable tunneling current density $J_{tun}$ of about 0.03 Amperes/cm$^2$ (as contrasted with the current density of substantially greater than 0.06 Amperes/cm$^2$ for curve R1). The voltage $V_{CG1}$ is then ramped up to overcome the electron repulsion buildup within the device with more electrons in the polysilicon floating gate electrode FG1.

A solution to the problem is to use a trapezoidal waveform R4 of voltage $V_{CG1}$ as shown in FIG. 4A. An initial write programming voltage is chosen so that a suitable tunneling voltage $V_{tw}$ applies on the tunneling oxide which results in a suitable tunneling current $I_{tun}$. As electrons are tunneled into the floating gate, a ramping voltage R4 is applied on the control gate CG1 to compensate for the electronic repulsion until the required programmed threshold is achieved.

Preferably the voltages applied during the application of voltage $V_{CG1}$ in accordance with the R4 waveform during the write mode are within the range of voltages in TABLES II and III.

TABLE II applies to Fowler Nordheim tunneling, as follows:

TABLE II

| | |
|---|---|
| $V_S$ = | 0 Volts to 0 Volts |
| $V_D$ = | 0 Volts to 0 Volts |
| $V_{sub}$ = | 0 Volts to O Volts |
| $V_{CG1}$ = | Control Gate Voltage |
| $V_S$ = | Source Voltage |
| $V_D$ = | Drain Voltage |
| $V_{sub}$ = | Substrate Voltage |

TABLE III applies to hot electron tunneling, as follows:

TABLE II

| | |
|---|---|
| $V_S$ = | 0 Volts to 0 Volts |
| $V_D$ = | 3 Volts to 6 Volts |
| $V_{sub}$ = | 0 Volts to 0 Volts |
| $V_{CG1}$ = | Control Gate Voltage |
| $V_S$ = | Source Voltage |
| $V_D$ = | Drain Voltage |
| $V_{sub}$ = | Substrate Voltage |

As stated above with curve R4, voltage $V_{CG1}$ varies from an initial value of just less than 10 Volts up to near 12 Volts during a time period of about 1 microseconds.

The erase cycle is done by applying the programming waveform to the source/drain while the control gate is grounded.

The constant current condition for EEPROM devices using Fowler-Nordheim tunneling current, like the FLOTOX EPROM for both write and erase operations, the equations to provide a constant current programming condition are described above with reference to Sik On Kong, et al. For hot electron tunneling such as the write operation of a FLASH memory, the hot electron current is usually too complicated to be described by an equation, because it depends upon several factors such as the channel dopant profile (three-dimensional), the collision probability of electrons with atoms so that the horizontal moving hot electrons are caused to deviate from their path and so they tunnel vertically through the silicon oxide. The initial (time=0) tunneling condition ($V_G$, $V_D$, dVt/dt) is normally determined experimentally, and then the $V_G$ voltage is ramped so that the tunneling current (equals $C_T$ dVt/dt) is constant with respect to time. The ramping waveform continues until the required $V_T$ is achieved.

Figure 5:
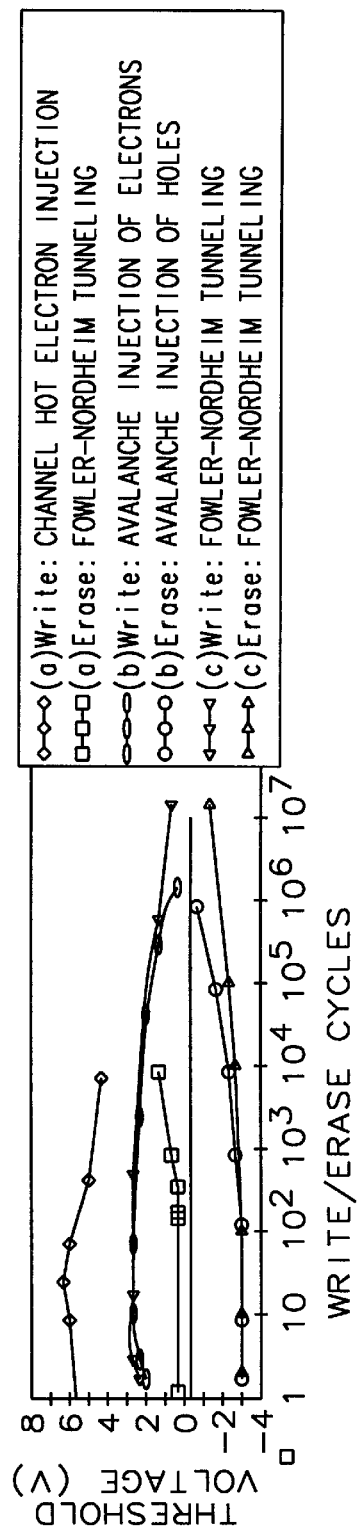
FIG. 5 shows the threshold voltage (V) window versus the number of write/erase cycles of three different EEPROM's.

FIG. 5 shows the threshold voltage (V) window versus the number of write/erase cycles of three different EEPROM's. The first (a) set of curves is for hot electron injection for write and Fowler-Nordheim tunneling for erase. The second (b) set of curves includes the curves for avalanche injection of electrons or holes for write and erase respectively. The third (c) set of curves includes Fowler-Nordheim tunneling for both write or erase.

Referring to FIGS. 6A–6C and 7A–7C for non-volatile memory devices, the voltages are as follows:

$V_g$ is the gate voltage
$V_d$ is the drain voltage
$V_s$ is the source voltage
$V_b$ is the substrate voltage In FIG. 6A there is a constant value of $V_g$ during programming. For flash memories with hot electron injection for write and Fowler-Nordheim tunneling for erase, the typical values are $V_g$=11V, $V_d$=5V, $V_s$=$V_b$=0 and the typical programming time is 10 μsec. Disadvantages are first, the slow programming speed as the electrons in the floating gate repel electrons, and second, the smaller number of write-erase cycle as the tunneling current has a high peak value at the start which degrades the tunnel oxide.

In FIG. 6B a trapezoidal programming waveform is shown in which $V_g$ ramps from a starting value with a rate which compensates the repulsion of electrons, so that the tunneling current is a constant. The constant current ensures optimum programming speed. Peak tunneling current in FIG. 6A is avoided. Therefore the tunnel oxide damage is reduced and the number of programming cycles increases.

Referring to FIG. 6C, within a chip, there are many memory cells (e.g. 4 million). The programming characteristics of those cells fluctuate. Therefore, with programming pulses, the threshold voltages achieved from cell-to-cell are widely distributed. FIG. 6C illustrate a type of "smart" programming. Short pulses are applied to each cell with some circuit monitoring of the resultant $V_{tp}$ (threshold voltage after programming) or alternately, the resultant Id current during a read operation. The latter is easier to be monitored. Pulses are applied until the desirable $V_{tp}$ is achieved. The maximum number of pulses applied is typically 32,000. This technique produces a much tighter spread of $V_{tp}$, but it does not solve the problem of the slow programming speed and the small number of write erase cycles.

$V_g$ Time
Idea a)

In FIG. 7A a stepped ramping pulse is employed instead of the linear ramping pulse in FIG. 6B. The advantage is that this waveform is much easier to generate in digital integrated circuit than the linear ramping waveform.

The increasing voltage is such that the tunneling current into the floating gate electrode is approximately constant with respect to time. The stepwise voltage can be applied to the control gate electrode, or to the drain of the non-volatile memory device.

To generate the waveform in FIG. 6B, an analog circuit such as operational amplifier A1 and large capacitor C1 shown in FIG. 9A need to be incorporated into the digital memory circuit as described below with reference to FIGS. 9A–9C. It is hard to optimize the characteristic of both analogue and digital circuit in a single chip.

In FIG. 7B there is a combination of the approaches of FIG. 6B and FIG. 6C. A series of pulses, with ramping amplitudes, are applied to the control gate. The voltage $V_{tp}$ is measured between each of the sets of pulses until the desired value of $V_{tp}$ is achieved. This programming scheme combines the advantage of tight $V_{tp}$ spread, fast programming and large number of write erase cycle.

A method of programming a non-volatile memory device (flash memory, EPROM and EEPROM) such that stepwise increasing programming pulses are intervened by the threshold voltage measurement, so that the number of pulses applied to each memory cell is just sufficient to produce the required threshold voltage change. A tight spread of threshold voltage between different cells is achieved.

In FIG. 7C there is a slight difference from the concept of FIG. 7B by having a ramping voltage for each pulse. The constant current condition is achieved ideally as in FIG. 6B. Referring again to FIG. 7C, as in FIG. 7B, the stepwise increasing pulse is linearly ramping. A better constant current programming condition is achieved so that the programming time is minimized. The number of write/erase cycles is maximized and the $V_T$ spread is minimized.

For the concepts of FIGS. 7B and 7C, there are two options:

First Option

The amplitude difference between two consecutive pulses is fixed. This difference is calculated to produce an approximate constant programming current condition. Pulses of increasing amplitude are applied to the floating gate until desired $V_{tp}$ is achieved.

Second Option

Figure 11A:
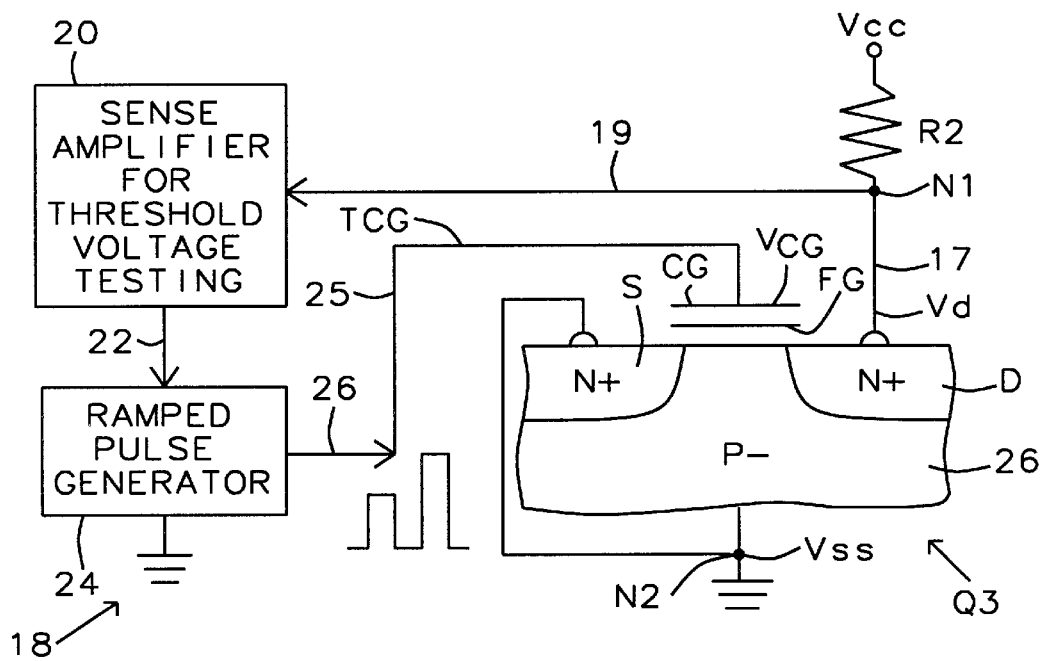
FIG. 11A shows an EPROM, EEPROM or flash memory cell as an FET device with a floating gate and a control gate electrode.

Referring to FIG. 11A, an EPROM, EEPROM or flash memory cell Q3 is shown as an FET device with a floating gate FG and a control gate electrode CG. The source S of transistor Q3 is connected via line 25 to node N2, as is the P-substrate 26 of transistor Q3. Node N2 connects source S and the substrate 26 to ground voltage $V_{SS}$. The drain D of transistor Q3 is connected via line 17 to node N1. Node N1 connects via resistor R2 to supply voltage $V_{CC}$. Node N1 also connects via line 19 to an input of sense amplifier 20. The sense amplifier provides an output on line 22 to ramped pulse generator 24. The output on line TCG from generator 24 is supplied to the control gate electrode CG of transistor Q3. In operation, of this circuit the $V_{tp}$ of after each pulse on line 19 from transistor Q3 is measured by a sense amplifier 20 which provides for threshold voltage testing of the cell Q3. The amplitude of the next pulse from pulse generator 24 is equal to the $V_{tp}$ value of cell Q3 plus a fixed amount that is provided by a ramped pulse generator 24. The output from generator 24 passes on line 26 to the control gate line TCG as voltage $V_{CG}$ to the control gate electrode CG of transistor Q3. This scheme takes care of those programming bits which are slow, so that programming speed is optimized for them also. The disadvantage is that it has to actually measure the $V_{tp}$ between pulses, other than setting an on/off action to determine whether the $V_{tp}$ is achieved, and to continue sending pulses if it is not.

Figure 11B:
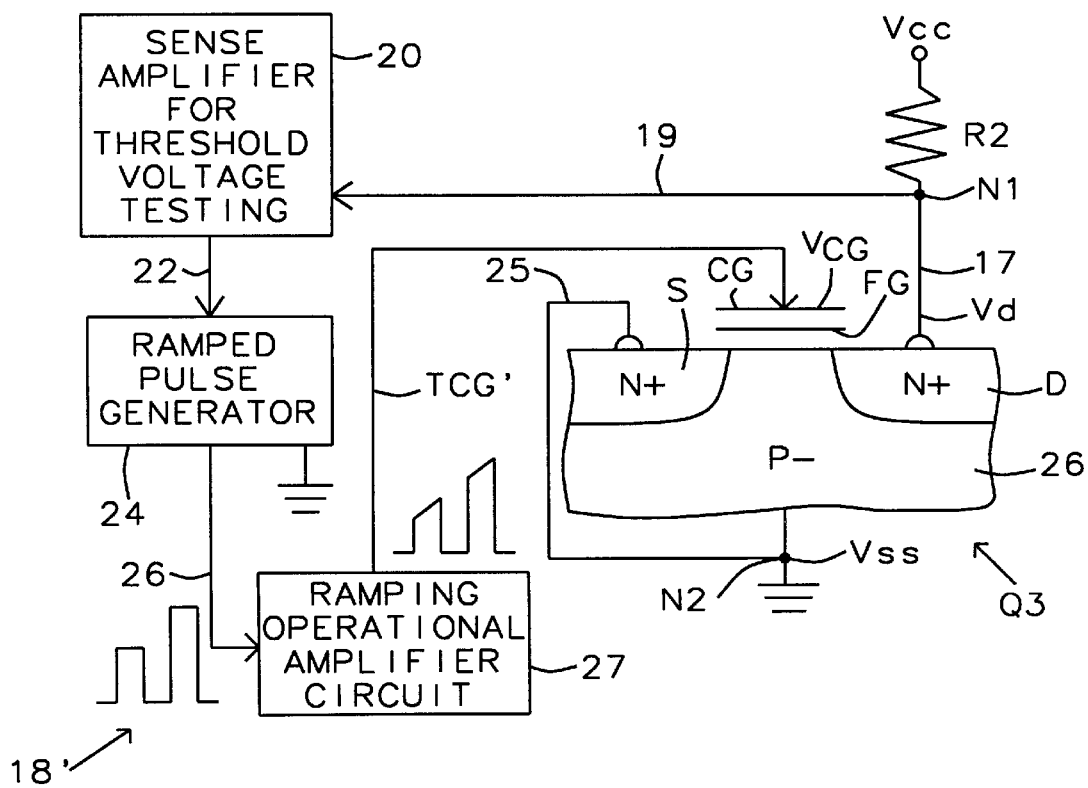
FIG. 11B shows the circuit based upon the circuit of FIG. 11A.

FIG. 11B shows the circuit 18' based upon the circuit of FIG. 11A where like parts have like functions with the ramped pulse generator 24 having its output pulse line 26 connected to the ramping operational amplifier circuit 27 which converts the ramped series of square wave pulses into a ramped series of sawtooth pulses as illustrated in FIG. 7C and as shown on FIG. 11B to alongside line TCG' which leads to the input to the control gate electrode CG.

Figure 12:
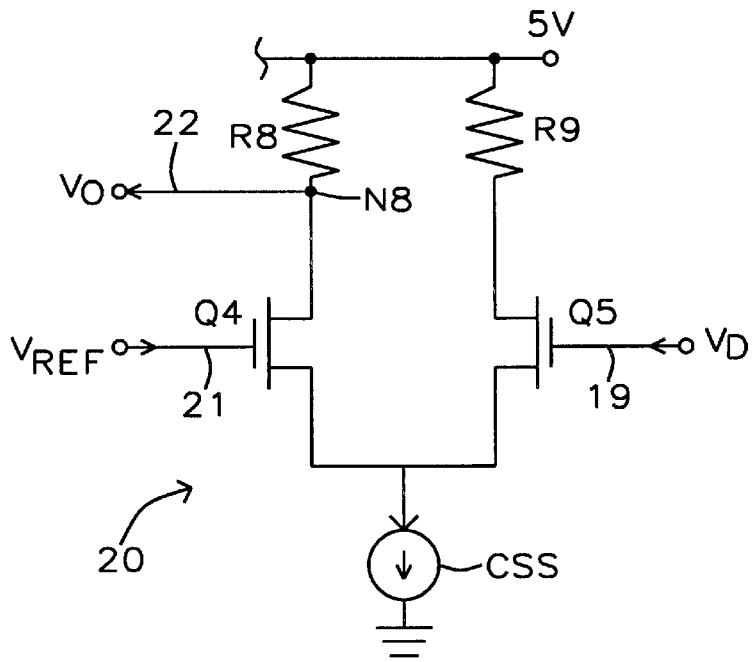
FIG. 12 shows a sense amplifier for threshold voltage testing of transistor Q3 in FIG. 11A.

FIG. 12 shows the sense amplifier 20 for threshold voltage testing of transistor Q3 in FIG. 11A. A supply voltage shown as the preferred value of five volts, 5V, is applied to the upper ends of resistors R8 and R9. Resistor R8 is connected at the other end via node N8 to the source/drain circuit of MOSFET transistor Q4, which connects down through constant current source CCS to ground. Resistor R9 is connected at the other end to the source/drain circuit of MOSFET transistors Q5 which also connects down through constant current source CCS to ground. The gate electrode of transistor Q5 is connected to line 19 from the drain side of cell Q3 in FIGS. 11A and 11B via lines 19 and 17. The gate electrode of transistor Q4 is connected via line 21 to a reference voltage $V_{REF}$ of about 4.5 Volts, for example. The output voltage from the sense amplifier 20 is supplied from node N8 via line 22 as output $V_O$.

Figure 13:
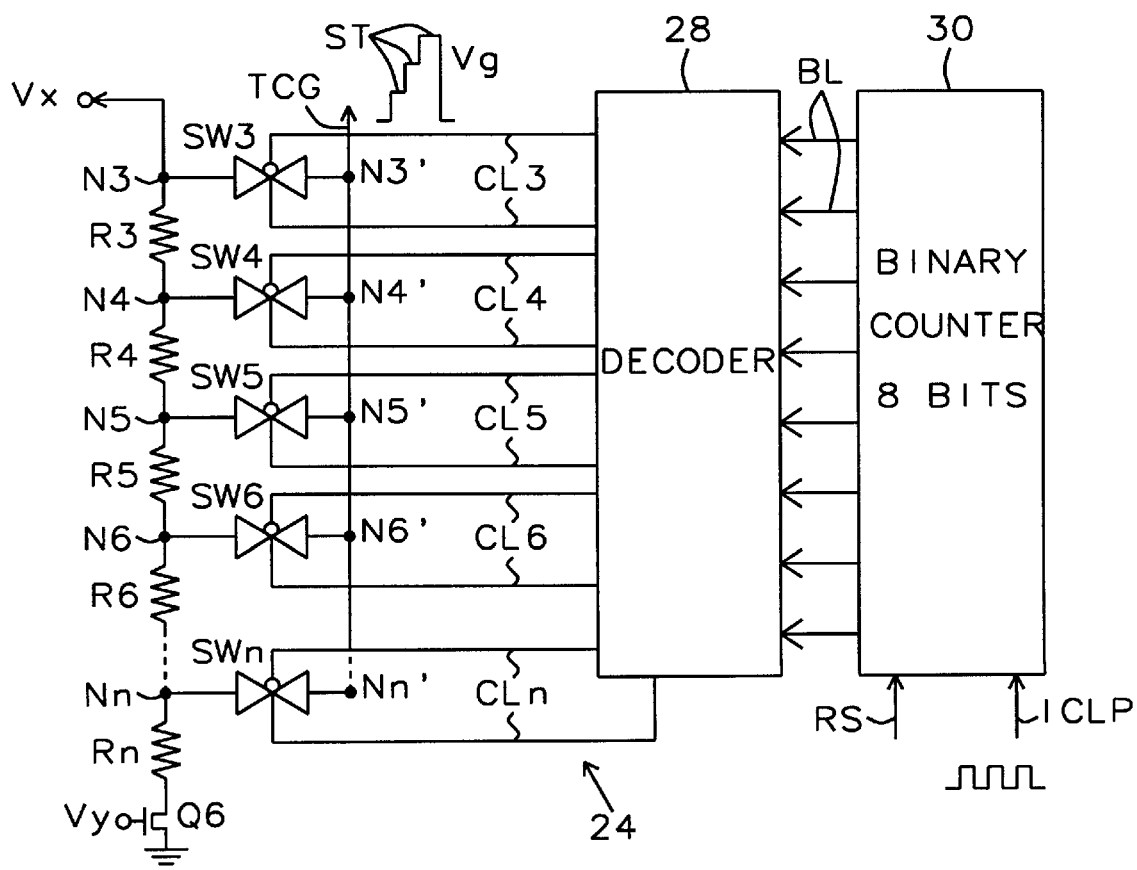
FIG. 13 shows the circuit diagram of the ramped pulse generator 24 of FIG. 11A.

FIG. 13 shows the circuit diagram of the ramped pulse generator 24 of FIG. 11A which is used to produce the results shown in FIGS. 7A, 7B and 7C by generating of stepwise increasing programming pulses with steps ST on line TCG. A clock signal ICLP is applied to a binary counter 30 so that it counts. The counting states (for example from 0 to 215) are decoded by a decoder 28 which turns on the transmission gates SW3, SW4 . . . SWn one at a time. The transmission gates SW3, SW4 . . . SWn are connected to a potential divider so that consecutive nodes of higher voltage are switched to the control gate of the memory cell to produce a stepwise increasing voltage waveform Vg. The clock frequency and the voltage step are so selected that an approximate constant tunneling current condition is established that is as follows:

$$C_T \frac{\Delta V}{\Delta t} = I_{tun} = \text{constant}$$

where $C_T$ is the total capacitance.

$I_{TUN}$ is the tunneling current chosen for the inclusion of programming speed an number of erase cycles.

$$\frac{\Delta V}{\Delta t}$$

is the step change of applied programming voltage per pulse duration

For FIG. 7B, where pulses are applied until the required threshold voltage is achieved, a sense amplifier is used for threshold voltage detection. Between each programming pulse, the memory cell is set into a read mode. A fixed gate voltage is applied to the control gate CG of FIG. 11A through the ramped pulse generator 24 by presetting the binary counter 30 in FIG. 13 to a certain value corresponding to the programmed threshold voltage. The drain voltage Vd in FIG. 11A is compared with mid voltage of 4.5 Volts so that if Vd is less than 4.5 Volts, the cell is considered to be programmed to the required threshold voltage. The sense amplifier 20 increases the speed of reading the voltage since a drop in the voltage from 5 Volts to 4.5 Volts initiates detection of the ID. This occurs instead of the voltage dropping from 5 Volts to 2.5 Volts before detection by a CMOS inverter. This is particularly important as the drains of many cells are connected to a bit line where the total capacitance is large and the voltage ramp is slow.

If the threshold is not achieved further pulses will be initiated by the pulse generator. Otherwise the programming is finished.

Referring to FIG. 7C, whereas the individual pulses are ramped, an operational amplifier like the one shown in FIG. 9A is connected between the pulse generator and the gate electrode so that each pulse has a ramping voltage added as shown in FIG. 11B.

Operation of generator 24 is controlled by an eight bit binary counter 30 which has eight output lines BL connected as inputs to a decoder 28. Counter 30 has an input clock pulse line ICLP for a square wave. A reset line RS for a reset signal is provided also.

Decoder 28 has a set of output line pairs CL3, CL4, CL5, CL6, . . . CLn connected to control a set of switches SW3, SW4, SW5, SW6, . . . SWn.

Switch SW3 connects node N3 to node N3', switch SW4 connects node N4 to node N4', switch SW4 connects node N5 to node N5', switch SW6 connects node N6 to node N6' and switch SWn connects node Nn to node Nn'. Nodes N3', N4', N5', N6', . . . Nn' are located along line TCG which is the output line from ramped square wave pulse generator 24 as described above in connection with FIGS. 11A and 11B.

Resistor R3 is connected between nodes N3 and N4. Resistor R4 is connected between nodes N4 and N5. Resistor R5 is connected between nodes N5 and N6. Resistor R6 is connected between nodes N6 and Nn, although more nodes and resistors may be included depending upon the number of steps to be provided by the ramped pulse generator 24 as indicated by the dotted lines between resistor R6 and node Nn.

The voltage $V_x$ is supplied to a voltage divider composed of the series of resistors R3, R4, R5, R6 . . . Rn, where n is a positive integer equal to the number of steps to be provided by ramp pulse generator 24. Nodes N3, N4, N5, N6, . . . Nn are connected to the tops of the respective resistors R3, R4, R5, R6, . . . Rn to provide a plurality of different voltages values divided down by the voltage divider composed of resistors R3, R4 . . . Rn. The resistor Rn is connected at the opposite end from node Nn through the source/drain circuit of MOSFET device Q6 to ground. The voltage $V_y$ is the control voltage which enables the step pulses on line TCG when the transistor Q4 is conducting. Otherwise the voltage on line TCG will be at $V_x$ when any one of the switches SW3, SW4, SW5, SW6, . . . SWn is closed.

The nodes N3, N4, N5, N6, . . . Nn connect through the inputs of switches SW3, SW4, SW5, SW6, . . . SWn to nodes N3', N4', N5', N6', . . . Nn' respectively to provide the stepped voltage $V_g$ with steps ST to line TCG which increases in value as the switches connect higher and higher towards switch SW3 where the value of $V_g=V_x$.

Figure 8:
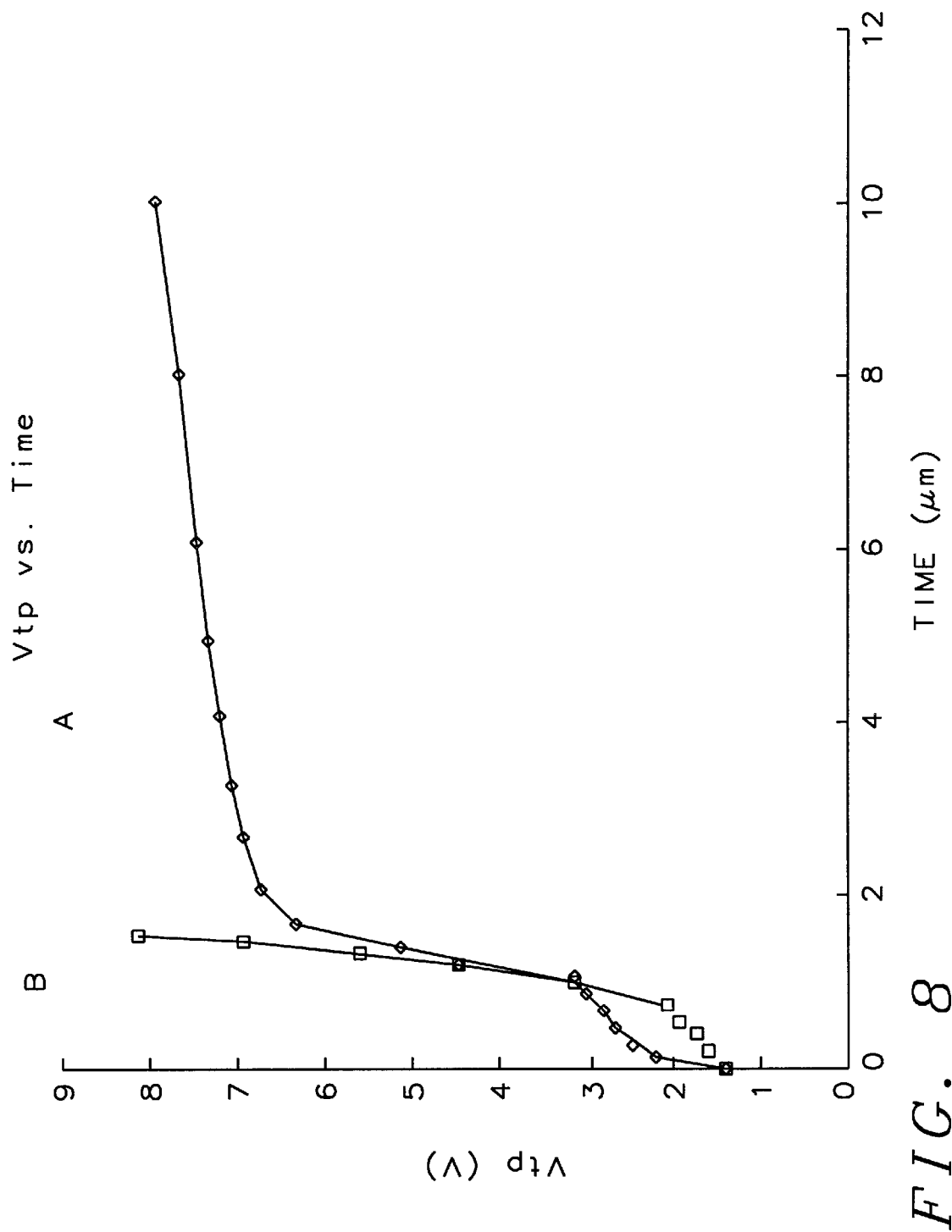
FIG. 8 shows actual experimental data of $V_{tp}$ vs. time ($\mu$sec.) for the curve A the system of FIG. 6A vs. the pulsed control gate voltage curve B in FIG. 7B.

The programming waveform provided on line TCG by the circuit of FIG. 11A from the ramped pulse generator 24 can be applied to all charge storage non-volatile memory devices, such as EPROM, EEPROM and FLASH memories. It can be applied to both NMOS and PMOS memory cells (with suitable reverse of all electrode voltages). It can be applied in memory devices programmed either by Fowler-Nordheim Programming, Hot channel electron tunneling, and avalanche injection of electron or hole. It can also be applied during the write and the erase operation. In the latter case, the programming voltage can be applied either to the gate, or to the drain electrode with suitable reverse of voltage polarity, depending on the design. FIG. 10A shows a device 94 and the description thereof, below. FIG. 10B FIG. 8 shows actual experimental data of $V_{tp}$ vs. time (μsec.) for the curve A the system of FIG. 6A vs. the pulsed control gate voltage curve B in FIG. 7B.

FIG. 9A shows an analog circuit 90 comprising an operational amplifier A1, with "+/−" inputs. The "+" input is connected to voltage $V_1$. The "−" input is connected to a node connected to the first ends of resistor R1 and capacitor C1. Resistor R1 is connected at its other end to voltage source $V_2$. Capacitor C1 is connected at its other end to the output 92 of operational amplifier A1. Analog circuit 90 is provided for incorporation into floating gate memories for the generation of a linear trapezoidal programming waveform for typical values such as the parameters, as follows:

$V_1$=10 V
$V_2$=5 V
R=1 MΩ
C=20 pf
t=1 μs
$\triangle$V=5 V

FIG. 9B shows the waveforms of voltages $V_1$ and $V_2$ with a square waveform for a duration "t" during which voltage $V_2$ falls below 0V whereas voltage $V_1$ rises above 0V for duration "t".

FIG. 9C shows the output on line 92 which is a pulse for duration "t" with a sawtooth value rising from the positive value $V_1$ by a value of $\triangle$V, which is defined by the relationship, as follows:

$$\Delta V = \frac{V_2}{RC} t$$

FIG. 10A shows a device 94 with the erase step or pulse voltage −VE applied to line 96 to the control gate electrode of floating gate memory MOS cell 94. The drain region D of cell 94 is connected by line 95 to a voltage of 0V. The source region S of cell 94 is connected by line 97 to a voltage of 0V or +5V. The substrate is at 0V.

FIG. 10B shows a device 98 with a voltage of 0V or −5V applied to line 100 to the control gate electrode of floating gate memory MOS cell 98. The erase step or pulse voltage+ VE is applied to drain region D of cell 98 by line 99. The source region S of cell 94 is disconnected and its voltage is allowed to float.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of programming an EEPROM memory device with a substrate on which a gate electrode stack is formed on a doped silicon semiconductor material, said gate electrode stack including a tunnel oxide layer, a floating gate electrode and a control gate electrode, a dielectric layer between said floating gate electrode and said control gate electrode, a source region and a drain region formed in said substrate self-aligned with said stack, said source region being at a source voltage $V_S$, said drain region being at a drain voltage $V_D$ and said substrate being at a substrate voltage $V_{Sub}$ comprising the steps as follows:

connecting a supply voltage $V_{cc}$ through a resistor to said drain region and connecting said source region to ground voltage $V_{ss}$, writing data to said floating gate electrode by applying an upwardly stepwise increasing control gate voltage $V_{CG1}$ waveform to said control gate electrode of said EEPROM device with a voltage ramp having a substantially constant tunneling current into said floating gate electrode, wherein said substantially constant tunnelling current is substantially constant with respect to time, providing measurements of said drain voltage $V_D$ with a voltage sensing testing device, and adjusting said upwardly stepwise increasing control gate voltage as a function of said measurements of said drain voltage $V_D$, whereby programming speed and the number of write/erase cycles is increased.

2. A method of programming a Flash EEPROM device in accordance with claim 1 including:

said providing measurements of said drain voltage $V_D$ with a voltage sensing testing device including threshold voltage testing of said drain voltage $V_D$ on said drain region, and said adjusting of said upwardly stepwise increasing control gate voltage as a function of said measurements of said drain voltage $V_D$, includes providing a ramped pulse output to said control gate electrode as a function of said threshold voltage testing.

3. A method of programming a Flash EEPROM device in accordance with claim 1 wherein:

said providing measurements of said drain voltage $V_D$ with a voltage sensing testing device includes threshold voltage testing of said drain voltage $V_d$ on said drain region, said adjusting of said upwardly stepwise increasing control gate voltage as a function of said measurements of said drain voltage $V_D$, includes providing a ramped pulse output to said control gate electrode as a function of said threshold voltage testing, and said threshold voltage testing comprises comparing said voltage of said drain electrode to a reference potential.

4. A method of programming a Flash EEPROM device in accordance with claim 1 wherein:

said providing measurements of said drain voltage $V_D$ with a voltage sensing testing device includes threshold voltage testing of said drain voltage $V_D$ on said drain region, said adjusting of said upwardly stepwise increasing control gate voltage as a function of said measurements of said drain voltage $V_D$, includes providing a ramped pulse output to said control gate electrode as a function of said threshold voltage testing, and said threshold voltage testing comprises comparing said voltage of said drain electrode to a reference potential with a pair of FET devices and a constant current source.

5. A method of programming a Flash EEPROM device in accordance with claim 1 including:

said providing measurements of said drain voltage $V_D$ with a voltage sensing testing device includes threshold voltage testing of said drain voltage $V_D$ on said drain region, said adjusting of said upwardly stepwise increasing control gate voltage as a function of said measurements of said drain voltage $V_D$, includes providing a ramped pulse output to said control gate electrode as a function of said threshold voltage testing, and providing said ramped pulse output to said control gate electrode by applying successively higher voltages from a voltage divider to said control gate electrode.

6. A method of programming a Flash EEPROM device in accordance with claim 1 including:

said providing measurements of said drain voltage $V_D$ with a voltage sensing testing device includes threshold voltage testing of said drain voltage $V_D$ on said drain region, said adjusting of said upwardly stepwise increasing control gate voltage as a function of said measurements of said drain voltage $V_D$, includes providing a ramped pulse output to said control gate electrode as a function of said threshold voltage testing, and providing said ramped pulse output to said control gate electrode by producing a sequence of increasingly higher counts to a decoder which operates sequential switching of successively higher voltages from a voltage divider.

7. A method of programming a Flash EEPROM device in accordance with claim 1 including:

said providing measurements of said drain voltage $V_D$ with a voltage sensing testing device including threshold voltage testing of said drain voltage $V_D$ on said drain region, and adjusting of said upwardly stepwise increasing control gate voltage as a function of said measurements of said drain voltage $V_D$, includes providing a ramped pulse output to said control gate electrode as a function of said threshold voltage testing by applying successively higher voltages from a voltage divider to said control gate electrode.

8. A method of programming a Flash EEPROM device in accordance with claim 1 wherein:

said providing measurements of said drain voltage $V_D$ with a voltage sensing testing device includes threshold voltage testing of said drain voltage $V_D$ on said drain region, said threshold voltage testing comprises comparing said voltage of said drain electrode to a reference potential, said adjusting of said upwardly stepwise increasing control gate voltage as a function of said measurements of said drain voltage $V_D$, includes providing a ramped pulse output to said control gate electrode as a function of said threshold voltage testing, and providing said ramped pulse output to said control gate electrode by producing a sequence of increasingly higher counts to a decoder which operates sequential switching of successively higher voltages from a voltage divider.

9. A method of programming a Flash EEPROM device in accordance with claim 1 including:

threshold voltage testing of said drain voltage $V_D$ on said drain region, providing a ramped pulse output to said control gate electrode as a function of said threshold voltage testing by applying successively higher voltage pulses from a voltage divider to said control gate electrode, and providing a ramping operational amplification to said successively higher voltage pulses.

10. A method of programming a Flash EEPROM device in accordance with claim 1 wherein:

said providing measurements of said drain voltage $V_D$ with a voltage sensing testing device includes threshold voltage testing of said drain voltage $V_D$ on said drain region, said adjusting of said upwardly stepwise increasing control gate voltage as a function of said measurements of said drain voltage $V_D$, includes providing a ramped pulse output to said control gate electrode as a function of said threshold voltage testing, and said threshold voltage testing comprises comparing said voltage of said drain electrode to a reference potential, providing said ramped pulse output to said control gate electrode by producing a sequence of increasingly higher counts to a decoder which operates sequential switching of successively higher voltage pulses from a voltage divider, and providing a ramping operational amplification to said successively higher voltage pulses.

11. An EEPROM memory device comprising:

a substrate on which a gate electrode stack is formed on a doped silicon semiconductor material, said gate electrode stack including a tunnel oxide layer, a floating gate electrode and a control gate electrode, a dielectric layer between said floating gate electrode and said control gate electrode, a source region and a drain region formed in said substrate self-aligned with said stack, said source region being at a source voltage $V_S$, a supply voltage $V_{cc}$ being connected through a resistor to said drain region and said source region being connected to ground voltage $V_{ss}$, said drain region being at a drain voltage $V_D$ and said substrate being at a substrate voltage $V_{Sub}$, means for writing data to said floating gate electrode by applying an upwardly stepwise increasing control gate voltage $V_{CG1}$ waveform to said control gate electrode of said EEPROM device with a voltage ramp having a substantially constant tunneling current into said floating gate electrode, wherein said substantially constant tunnelling current is substantially constant with respect to time, means for providing measurements of said drain voltage $V_D$ with a voltage sensing testing device, and means for adjusting said upwardly stepwise increasing control gate voltage as a function of said measurements of said drain voltage $V_D$, whereby programming speed and the number of write/erase cycles is increased.

12. An EEPROM device in accordance with claim 11 including:

said means for providing measurements of said drain voltage $V_D$ with a voltage sensing testing device including means for threshold voltage testing of said drain voltage $V_D$ on said drain region, and said means for adjusting of said upwardly stepwise increasing control gate voltage as a function of said measurements of said drain voltage $V_D$, includes means for providing a ramped pulse output to said control gate electrode as a function of said threshold voltage testing.

13. An EEPROM device in accordance with claim 12 wherein:

said means for threshold voltage testing compares said drain voltage $V_D$ of said drain electrode to a reference potential, means for providing said ramped pulse output to said control gate electrode by producing a sequence of increasingly higher counts to a decoder which operates sequential switching of successively higher voltage pulses from a voltage divider, and means for providing a ramping operational amplification to said successively higher voltage pulses.

14. An EEPROM device in accordance with claim 11 wherein:

said means for providing measurements of said drain voltage $V_D$ with a voltage sensing testing device including means for threshold voltage testing of said drain voltage $V_D$ on said drain region, and said means for adjusting of said upwardly stepwise increasing control gate voltage as a function of said measurements of said drain voltage $V_D$, includes means for providing a ramped pulse output to said control gate electrode as a function of said threshold voltage testing, said means for threshold voltage testing compares said voltage of said drain electrode to a reference potential.

15. An EEPROM device in accordance with claim 11 wherein:

said means for providing measurements of said drain voltage $V_D$ with a voltage sensing testing device including means for threshold voltage testing of said drain voltage $V_D$ on said drain region, and said means for adjusting of said upwardly stepwise increasing control gate voltage as a function of said measurements of said drain voltage $V_D$, includes means for providing a ramped pulse output to said control gate electrode as a function of said threshold voltage testing, said means for threshold voltage testing compares said voltage of said drain electrode to a reference potential with a pair of FET devices and a constant current source.

16. An EEPROM device in accordance with claim 11 including:

said means for providing measurements of said drain voltage $V_D$ with a voltage sensing testing device including means for threshold voltage testing of said drain voltage $V_D$ on said drain region, and said means for adjusting of said upwardly stepwise increasing control gate voltage as a function of said measurements of said drain voltage $V_D$, includes means for providing a ramped pulse output to said control gate electrode as a function of said threshold voltage testing, means for providing said ramped pulse output to said control gate electrode by applying successively higher voltages from a voltage divider to said control gate electrode.

17. An EEPROM device in accordance with claim 11 including:

said means for providing measurements of said drain voltage $V_D$ with a voltage sensing testing device including means for threshold voltage testing of said drain voltage $V_D$ on said drain region, and said means for adjusting of said upwardly stepwise increasing control gate voltage as a function of said measurements of said drain voltage $V_D$, includes means for providing a ramped pulse output to said control gate electrode as a function of said threshold voltage testing, means for providing said ramped pulse output to said control gate electrode by producing a sequence of increasingly higher counts to a decoder which operates sequential switching of successively higher voltages from a voltage divider.

18. An EEPROM device in accordance with claim 11 including:

said means for providing measurements of said drain voltage $V_D$ with a voltage sensing testing device including means for threshold voltage testing of said drain voltage $V_D$ on said drain region, said means for adjusting of said upwardly stepwise increasing control gate voltage as a function of said measurements of said drain voltage $V_D$, includes means for providing a ramped pulse output to said control gate electrode as a function of said means for threshold voltage testing by applying successively higher voltages from a voltage divider to said control gate electrode.

19. An EEPROM device in accordance with claim 11 wherein:

said means for providing measurements of said drain voltage $V_D$ with a voltage sensing testing device including means for threshold voltage testing of said drain voltage $V_D$ on said drain region, said means for threshold voltage testing compares said voltage of said drain electrode to a reference potential, said means for adjusting of said upwardly stepwise increasing control gate voltage as a function of said measurements of said drain voltage $V_D$, includes means for providing a ramped pulse output to said control gate electrode as a function of said threshold voltage testing, and means for providing said ramped pulse output to said control gate electrode by producing a sequence of increasingly higher counts to a decoder which operates sequential switching of successively higher voltages from a voltage divider.

20. An EEPROM device in accordance with claim 11 including:

means for threshold voltage testing of said drain voltage $V_D$ on said drain region, means for providing a ramped pulse output to said control gate electrode as a function of said means for threshold voltage testing by applying successively higher voltage pulses from a voltage divider to said control gate electrode, and means for providing a ramping operational amplification to said successively higher voltage pulses.

* * * * *